United States Patent [19]

Yamashita et al.

[11] 3,931,039

[45] Jan. 6, 1976

[54] COMPOSITION FOR DIFFUSING PHOSPHORUS

[75] Inventors: Mitsuo Yamashita; Akio Mikogami, both of Tokyo; Masashi Hasegawa; Hiroshi Oizumi, both of Kanagawa, all of Japan

[73] Assignee: Denki Kagaku Kogyo Kabushiki Kaisha, Tokyo, Japan

[22] Filed: Nov. 1, 1973

[21] Appl. No.: 411,766

[52] U.S. Cl............. 252/184; 148/189; 252/62.3 R; 252/63.5; 252/500; 252/950; 252/951; 423/302
[51] Int. Cl.²....................H01B 3/02; H01L 21/225; H01L 21/223
[58] Field of Search....... 252/184, 62.3 R, 950, 951, 252/63.5, 500; 148/189; 423/302

[56] References Cited
UNITED STATES PATENTS

| | | | |
|---|---|---|---|
| 3,486,951 | 12/1969 | Norby | 252/62.3 R |
| 3,849,344 | 11/1974 | McMurtry et al. | 252/500 |

*Primary Examiner*—Benjamin R. Padgett
*Assistant Examiner*—Irwin Gluck
*Attorney, Agent, or Firm*—Holman & Stern

[57] ABSTRACT

A phosphorus nitride-silicon oxide composition having good thermal stability and diffusion characteristics for use as a diffusant source of n-type impurities for a semi-conductor device.

6 Claims, 2 Drawing Figures

COMPOSITION FOR DIFFUSING PHOSPHORUS

This invention relates to a phosphorus nitride — silicon oxide composition and more particularly to a composition containing phosphorus nitride having a good thermal stability and diffusion characteristics for use as a diffusant source of n-type impurities of a semiconductor device and to a method of preparing the composition.

It has been known that a n-type region is formed by diffusing phosphorus into silicon in order to produce a semi-conductor device such as transistor, diode, IC, etc. and that $POCl_3$, $PH_3$, $P_2O_5$ and the like have been used as a phosphorus source.

Meanwhile, where a P-type region is to be formed by diffusing boron into silicon, it was a common practice to evaporate a liquid such as $B Br_3$ to effect diffusion in a gaseous condition. Recently it has often been put into practice to use a wafer comprising as a major ingredient boron nitride (Hereinafter referred to as a BN wafer.). In this method BN wafers are placed alternately with silicon wafers, each wafer being spaced at intervals of 2–3 mm, and then the wafers are heated to a predetermined temperature to thereby diffuse boron into silicon. This method is known as a surface diffusion method. With its accuracy and ease in operation the method has prevailed widely for the diffusion of boron.

There has for a long time been a need for a phosphorus diffusion source which enables stable diffusion with accuracy like a BN wafer. Although a surface diffusion method by the use of a phosphorus nitride wafer was known, this method has not yet been put to practical use due to the fact that phosphorus nitride is thermally unstable and readily decomposes. Alternately, a method is known in which phosphorus nitride is formed on the surface of a graphite plate wafer by gaseous reaction of $PH_3$ with $NH_3$, and the resulting product is used as a phosphorus diffusion source. The method, however, involves various drawbacks, for example difficulties in producing a great deal of uniform wafers and in effecting stable diffusion for a long period of time because the wafer obtained is of such structure that phosphorus nitride is in the form of an extremely thin film and the film has low adhesion to the graphite plate.

Accordingly, it is an object of the present invention to provide a wafer for phosphorus diffusion which makes it possible to effect stable diffusion for a long period of time.

Another object of the invention is to provide a method to prepare wafers for phosphorus diffusion which can be mass-produced at relatively low cost.

A further object of the invention is to provide a stable and accurate method for diffusing phosphorus with a phosphorus diffusion source prepared in accordance with the present invention.

The above objects of the invention are achieved by the use of sintered bodies made by mixing phosphorus nitride with silicon dioxide and then subjecting the mixture to a hot pressing process.

The details of the present invention will be apparent from the following description.

What is generally called "phosphorus nitride" includes $PN$, $P_4N_6$, $P_3N_5$ and amorphous phosphorus nitride (molar ratio of N/P : 0.9 – 1.7). They are thermally unstable and start to decompose at approximately 500°c and abruptly at 850° – 900°C in an inert atmosphere. In an oxidic atmosphere they start to be oxidized at about 150°C to form $P_2O_5$.

Since phosphorus nitride has poor sintering property, hot pressed sintered bodies consisting only of phosphorus nitride are rather fragile. Furthermore, the use of a product made of sintered bodies consisting only of phosphorus nitride results in decomposition of phosphorus nitride upon heating during diffusion so that the wafer will bend and/or swell up. Thus, it is not possible to easily make use of such a wafer even several times for diffusing phosphorus. Additionally, $P_2O_5$ formed by the oxidation of phosphorus nitride has extremely high hygroscopicity. And the so formed $P_2O_5$ will absorb moisture in the course of treatment and change into phosphoric acid $H_3PO_4$ which causes the wafer to swell up during diffusion.

It has been found that a phosphorus nitride wafer having good diffusion characteristics can be obtained by hot pressing a mixture of phosphorus nitride powder and silicon dioxide powder. Any powder of phosphorus nitride will do so long as it contains little alkali metal and heavy metal which will exert unfavorable influences upon the characteristics of semi-conductors. Preferably the size of the powder is $1_{mm}$ or less in diameter.

Silicon dioxide to be incorporated with phosphorus nitride acts not only as a binder for phosphorus nitride but also as a suppressor against the effects of $P_2O_5$. Preferably the silicon dioxide is of fine particle shape and in high purity. For instance, commercially available white carbon made by a dry method containing $10_{ppm}$ or less of alkali metal and $1000_{ppm}$ or less of heavy metal is preferred.

The compounding ratio of phosphorus nitride to silicon dioxide may be preferably 95 – 30 percent by weight : 5 – 70 percent by weight, particularly 90 – 70 percent by weight 10 – 30 percent by weight of silicon dioxide. Below 5 percent by weight of silicon dioxide sintered bodies would have poor strength and instability when subjected to a heating process, while above 70 percent by weight of silicon dioxide it would be difficult to make up the bodies into a wafer, besides the wafer would readily bend when heated.

The hot press process which comprises incorporating phosphorus nitride with silicon dioxide may be suitably carried out in an inert atmosphere at a temperature of 700° – 950°C under a pressure above $50_{kg}/cm^2$ for 5 – 60 minutes by means of a graphite mold. An inert gas usable in this process is a gas which does not react with phosphorus nitride, for example nitrogen, argon, helium and the like. The mold may be of any material unless it is reactable with phosphorus nitride within the range of 700° – 950°C and may be of any type if it is resistant to high pressure. Molds made of graphite have the advantages of good machinability and in addition thereto such molds can be heated by high frequency radiation. When the hot pressing temperature is below 700°C, it is impossible to proceed on sintering so that the hot pressed bodies have poor strength, whereas above 950°C much phosphorus nitride volatilizes. Thus, the temperature should be within the range of 700° – 950°C, particularly 850° – 900°C.

When pressure above $50_{kg}/cm^2$ is applied a suitable hot pressed product is obtained. The maximum pressure may not be limited if it is within a range allowable for the strength of mold. Usually, in case of using a carbon mold $500_{kg}/cm^2$ or less is proper. Hot pressing too long results in much volatilized phosphorus nitride.

Thus, most preferably the hot pressing period may be approximately half an hour. The hot pressed product thus obtained is a relatively porous sintered body having a density of 1.2 – 1.7$_g$/cm$^3$ and Shore hardness of 20 – 60. From the bodies disks 0.7 – 1.5$_{mm}$ thick (wafers) are cut with a diamond-tipped cutter. The disks are then used for surface diffusion of phosphorus.

A method for diffusing phosphorus using a phosphorus nitride — silicon dioxide wafer obtained in accordance with the present invention (hereinafter referred to as a phosphorus nitride wafer) will be made clear with reference to the following description.

Figure 1:
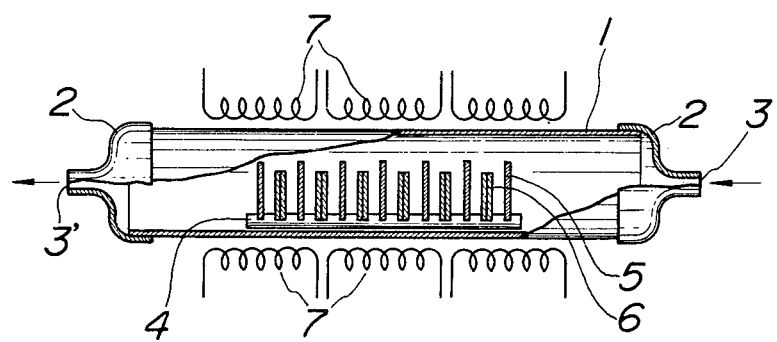
FIG. 1 is a schematic view illustrating a device by means of which the method of the invention is carried out.

Reference is now made to FIG. 1 in which: Reference numeral 1 refers to a quartz tube, reference numeral 2 to a quartz cap, reference numeral 3 to a gas inlet, reference numeral 3' to a gas outlet, reference numeral 4 to a quartz boat, reference numeral 5 to a phosphorus nitride wafer, reference numeral 6 to a silicon wafer and reference numeral 7 to an electrical heater.

Figure 2:
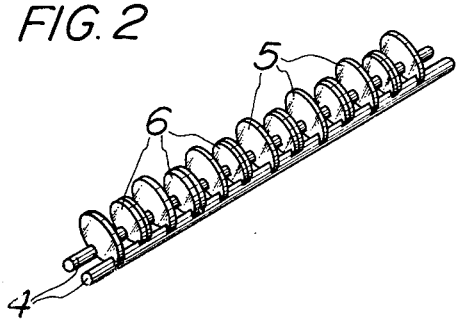
FIG. 2 is a schematic view showing the wafers of the present invention.

Two silicon wafers are put together with the surface to be diffused turned outwardly. The diffusion process comprises a first and second step. In the first step phosphorus nitride wafers 5 and the pairs of silicon wafers 6 are set up on the quartz boat 4 as shown in FIG. 2. These are then, after cap 2 is taken off, placed in tube 1, through which nitrogen gas or a gas mixture of nitrogen and oxygen, etc. is introduced at 1 – 3$l$/min. Temperature and period of time to be treated in the quartz tube 1 can vary depending on the required phosphorus concentration in silicon. Where a relatively large amount of phosphorus is to be diffused, the temperature must be higher for a longer time, and if on the contrary a relatively small amount should be diffused the subject to be treated must be at a lower temperature for a shorter period. In general the wafers are treated at 600° – 900°C for 15 – 60min. After being treated for a predetermined period as shown in FIG. 1, the wafers on the boat are pulled out of the tube 1. Illustrated hereinabove is a first step.

In the second step the silicon wafers thus obtained are detached from the quartz boat 4 and then with or without etching the surfaces thereof further subjected to a heating treatment in a furnace to re-distribute phosphorus into the silicon wafers whereby a semi-conductor device having a desired profile of phosphorus is obtained.

In the meanwhile, new pairs of silicon wafers are set as hereinbefore described and phosphorus diffusion is again effected in the same manner as set forth. These cycles are repeated until the phosphorus nitride wafers are used up due to volatilization.

The most important thing in diffusing phosphorus is that phosphorus should be diffused uniformly into any part of a silicon wafer and into all the wafers as well. If uniform diffusion is not made, each of the semi-conductors produced may have different characteristics.

The method of the present invention has made it possible to effect uniform phosphorus diffusion. More specifically, wafers prepared according to the present invention may be, before using them in a phosphorus diffusion process, subjected to a pre-treatment wherein wafers are heated in a wet or oxidic atmosphere. If the pre-treatment is not applied wafers may be diffused in a wet or oxidic atmosphere, or the both methods may be used jointly.

The reason for the treatment in a wet or oxidic atmosphere will be made clear if the chemical reactions according to the method of the present invention are understood. Phosphorus nitride contained in the wafer is oxidized to $P_2O_5$, which then reacts with $H_2O$ to produce $H_3PO_4$ on the surface of phosphorus nitride wafers and subsequently the so-formed $H_3PO_4$ partly containing $P_2O_5$ vaporizes and deposits on the surface of silicon wafers. $H_3PO_4$ deposited diffuses into silicon and forms an N-type region. In a prior art method phosphorus nitride is predominantly decomposed into elemental phosphorus, in the form of which phosphorus is diffused into the silicon wafers. In handling or treating wafers it is inevitable that the surface of the phosphorus nitride wafers are oxidized slightly for example when wafers are put into or out of the quartz tube. Thus, it may necessarily occur that $P_2O_5$ and $H_3PO_4$ formed on the surface of phosphorus nitride wafers vaporize together with elemental phosphorus into silicon wafers. In such case diffusion of phosphorus into silicon may vary depending on to what extent phosphorus nitride is oxidized. Accordingly, a uniformly diffused silicon wafer is not available by the prior art method.

It would be surmised that $P_2O_5$ and $H_3PO_4$ formed by heating a phosphorus nitride wafer in a wet or oxidic atmosphere may cause the wafer to be adhesive or to swell or bend upon heating. It is however little worth consideration to take notice of such a phenomenon. Although the greater part of $P_2O_5$ and $H_3PO_4$ occurred by oxidation are vaporized during a diffusion process, the remaining $P_2O_5$, if any, reacts with $SiO_2$ contained in the wafer of the present invention to form silicon phosphate $P_2O_5.SiO_2$. Being stabilized, $P_2O_5$ is deprived of its hygroscopic property. Thus, the formation of $P_2O_5$ or $H_3PO_4$ may not be a cause for swelling or bending upon heating. That is to say, incorporation of $SiO_2$ renders $P_2O_5$ to be stabilized in addition to its effect as a binding material for phosphorus nitride powder.

An oxidic atmosphere may be an inert gas containing moisture and/or oxygen. In the case where pre-treatment in which phosphorus nitride wafer is oxidized before diffusing phosphorus is applied, the wafer is pre-treated at 500° – 900°C for 0.5 – 3 hours introducing a nitrogen gas saturated with water vapor of 0° – 30°C or a gas mixture consisting of nitrogen and 0.1 – 10 percent by volume of oxygen. More oxygen or water vapor content will increase the amount to be oxidized, which will shorten the lifetime of wafer. After such pre-treatment the subsequent diffusion process may be carried out in an inert atmosphere. The above mentioned oxidation treatment is again applied when $P_2O_5$ formed in the pre-treatment is almost used up and thus the phosphorus diffusion process does not proceed well.

In the case where the wafer is not pre-treated, a diffusion process may be made in an atmosphere similar to that employed in the pre-treatment. However, the amount of oxygen or water vapor may be reduced to 1/5 – 1/100 of the amount used in the pre-treatment.

In the following examples there are described embodiments of the present invention.

EXAMPLE 1

To 80 parts by weight of phosphorus nitride powder shown in Table I prepared by reacting phosphorus pentsulphide with NH$_3$ was added 20 parts by weight of white carbon (prepared by the dry method).

Table I

| | |
|---|---|
| N | 42.71 % |
| P | 57.19 % |
| Al | 100 ppm |
| Ca | 10 ppm |
| Fe | 170 ppm |
| Si | 250 ppm |
| Cr | 110 ppm |
| Ni | 90 ppm |
| Mn | 80 ppm |
| Na, N | Not detected |
| Particle diameter | 0.5$_{mm}$ or less |

Then the mixed powder was hot pressed by placing the mixture in a graphite mold, applying a pressure of 80kg/cm$^2$ in an atmosphere of a nitrogen gas for 30min. at 850°C. A hot pressed body thus obtained had an outside diameter of 45$_{mm}$ and was 60$_{mm}$ long. The product showed a density of 1.35g/cm$^3$ and Shore hadness of 35. Thereafter, phosphorus nitride wafers, each having a diameter of 45$_{mm}$ and a thickness of 1.0mm, were made of the hot pressed product with a diamond-tipped cutter. The phosphorus nitride wafers were stood on a grooved quartz boat alternately with silicon wafers. These wafers were then led into a quartz tube heated to 800°C. At a flow rate of 1$l$/min. a nitrogen gas saturated with water vapor of 1°C was introduced into the tube and maintained for 30 minutes to thereby diffuse phosphorus into silicon, and thereafter the wafers were drawn out of the quartz tube. Subsequently, only the silicon wafers were placed in a quartz tube, which was then set in a furnace kept at 1200°C for 30 minutes under a stream of nitrogen whereby phosphorus was re-distributed into the silicon wafers. After etching the surfaces of the silicon wafers with an aqueous fluoric acid, surface resistance thereof was measured. It was confirmed that there existed a uniform n-type region and the product had a resistance of 2.5±0.1 ohms per sq.

The used phosphorus nitride wafers did not show deformation such as bending or swellings and retained a smooth surface.

EXAMPLE II 65 parts by weight of phosphorus nitride powder prepared in the same way as in Example I and 35 parts by weight of white carbon (prepared by the dry method) were mixed. The mixture was introduced into a graphite mold having an inner diameter of 45mm and subjected to hot pressing at 800°c under a pressure of 150 Okg/cm$^2$ for 45 minutes in an argon atmosphere. The hot pressed body thus obtained (45mm $\phi$ × 55mm in length) had a density of 1.43g per cm$^3$ and Shore hardness of 45. Wafers (45mm × 1mm in thickness), which had been made of the product, were pre-treated at 850°C for 1 hour introducing a stream of a nitrogen gas saturated with water vapor of 20°C. The pre-treated wafers were set up on a grooved quartz boat alternately with silicon wafers, and put into a quartz tube, maintained at a temperature of 800°C in a diffusion furnace and kept for 30 minutes in a dry nitrogen gas at a flow rate of 2.0 $l$/min. After the treatment the wafers were taken out of the quartz tube. The Silicon wafers were etched with an aqueous fluoric acid to remove the deposits on the surface, after which the wafers were subjected to a second or re-distribution step at 1150°C for 30 minutes under a nitrogen gas. The final silicon wafers had a uniform n-type region, having a surface resistance of 37.5 ± 0.5 ohms. per sq.

EXAMPLE III 90 parts by weight of phosphorus nitride powder prepared in the same way as in Example I and 10 parts by weight of white carbon (prepared by the dry method) were mixed and the mixed powder was hot pressed with a graphite mold (50mm in inner diameter) at 900°C under 80$_{kg}$/cm$^2$ for 30 minutes under a nitrogen atmosphere. The hot pressed body thus obtained (50 $\phi$ × 65mm in length) showed a density of 1.29$_g$/cm$^3$ and Shore hardness of 28. Of the hot pressed product, wafers 1mm thick were made. These wafers were pre-treated in a gas mixture consisting of 5 percent of oxygen and 95 percent of nitrogen at a temperature of 750°C for 30 minutes. In the same manner as shown in Example 2, phosphorus diffusion was effected with the thus treated wafers. Confirmation was shown by the fact that the silicon wafers obtained had a uniform n-type region and 36.9 ± 4Ω/sq in surface resistance.

EXAMPLE IV 40 parts by weight of phosphorus nitride powder prepared in Example I and 60 parts by weight of white carbon (prepared by the dry method) were mixed and the mixture was subjected to hot pressing in an atmosphere of a nitrogen gas by the use of a graphite mold under a pressure of 150kg/cm$^3$ and 900°C for 30 minutes. The hot pressed bodies (50mm $\phi$ × 65mm in length) had a density of 1.23g/cm$^3$ and Shore hardness of 55. Wafers having a thickness of 1 mm were produced from the bodies. Without pre-treating the wafers, phosphorus diffusion into silicon wafers was effected at 850°C for 60 minutes under a stream of a mixture of a nitrogen gas saturated with 5°C water vapor. These silicon wafers were re-distributed in the same manner as set forth in Example (second step) I. The forming of a uniform n-type region with 1.7 ± 0.1 ohm/sq in surface resistance was confirmed.

EXAMPLE V

A mixture of 80 parts by weight of phosphorus nitride and 20 parts by weight of white carbon (prepared by the dry method) were hot pressed at 750°C for 10 minutes under a pressure of 200kg/cm$^2$ with a graphite mold in an atmosphere of a nitrogen gas. The hot pressed bodies thus obtained (40$_{mm}$ $\phi$ × 55mm in length) showing a density of 1.31g/cm$^3$ and Shore hardness of 32 were cut into a plurality of wafers having a thickness of 1mm. The wafers were pre-treated at 700°C for 2 hours in a gas mixture of 1 percent of oxygen and 99 percent of nitrogen. From the pre-treated wafers phosphorus was diffused into silicon wafers at 800°C for 30 minutes in a steam of a nitrogen gas saturated with water vapor of 0°C. Subsequently, without etching the silicon wafers they were heated in 1050°C and maintained for 15 minutes in a nitrogen gas to thereby re-distribute phosphorus into the silicon wafers. It was found that there were formed a uniform n-type region in the silicon wafers and surface resistance thereof had 320 ohm./sq.

EXAMPLES 6, 7 and 8

Mixing 80 parts by weight of phosphorus nitride powder with 20 parts by weight of white carbon (prepared by the dry method), the mixed powder was hot pressed at 890°C for 30 minutes under 80kg/cm² in an atmosphere of a nitrogen gas using a graphite mold. The hot pressed bodies thus produced had a diameter of 55mm and length of 65mm and showed a density of 1.30g/cm³ and Shore hardness of 33. Of the bodies wafers 1mm thick were made. Under the conditions shown in Table 2 phosphorus diffusion into silicon wafers was effected. In all of the cases the forming of a uniform n-type region was confirmed.

The phosphorus nitride wafers after use had no swellings or bending and the surfaces thereof were excellent in appearance.

Table 2

| Example No. | Pre-treatment | | | Diffusion (First step) | | | Etching after the first step | Diffusion (Second step) | | | Surface resistance of silicon wafer (ohms/sq) |
|---|---|---|---|---|---|---|---|---|---|---|---|
| | Atm. | Temp. (°C) | Time (hr.) | Atm. | Temp. (°C) | Time (min.) | | Atm. | Temp (°C) | Time (min.) | |
| 6 | N₂ saturated with 20°C H₂O | 600 | 1.0 | 01.%O₂ 99.9%N₂ | 700 | 30 | No | N₂ | 1050 | 15 | 410± 5 |
| 7 | K₂ saturated with 15°C H₂O | 800 | 1.0 | dry N₂ | 750 | 30 | Yes | N₂ | 1200 | 30 | 83 ± 1.5 |
| 8 | 5% O₂ and 95%N₂ | 550 | 2.5 | N₂ saturated with 0°C H₂O | 600 | 15 | Yes | N₂ | 1100 | 30 | 1130 ± 2.5 |

What we claim is:

1. A composition for diffusing phosphorus which comprises 30 – 95 percent by weight of phosphorus nitride and 70 – 5 percent by weight of silicon dioxide.

2. A composition as claimed in claim 1 wherein the composition is in the form of wafer.

3. A wafer as claimed in claim 2 treated with an inert gas saturated with water vapor having a temperature of 0° – 30°C at 500° – 900°C for 0.5–3.0 hours.

4. A wafer as claimed in claim 2 treated with a gas mixture of 0.1–10 percent by volume of oxygen and 99.9–90 percent by volume of an inert gas at 500°–900°C for 0.5 – 3.0 hours.

5. A method for treating a wafer as claimed in claim 2 with an inert gas saturated with water vapor having a temperature of 0° – 30°C at 500° – 900°C for 0.5 – 3.0 hours.

6. A method for treating a wafer as claimed in claim 2 with a gas mixture of 0.1 – 10 percent by volume of oxygen and 99.9 – 90 percent by volume of an inert gas at 500° – 900°C for 0.5 – 3.0 hours.

* * * * *